(12) United States Patent
Chiriac

(10) Patent No.: US 7,821,787 B2
(45) Date of Patent: Oct. 26, 2010

(54) SYSTEM AND METHOD FOR COOLING USING IMPINGING JET CONTROL

(75) Inventor: Victor A. Chiriac, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 120 days.

(21) Appl. No.: 12/201,932

(22) Filed: Aug. 29, 2008

(65) Prior Publication Data

US 2010/0053894 A1 Mar. 4, 2010

(51) Int. Cl.
*H05K 7/20* (2006.01)
*F28F 13/12* (2006.01)
*H02K 33/00* (2006.01)
*H05K 5/00* (2006.01)

(52) U.S. Cl. ............ 361/695; 361/679.48; 454/184; 165/122; 165/80.3; 165/908; 310/16; 310/12.29; 34/488

(58) Field of Classification Search ............ 361/679.48, 361/691, 694, 695, 717–719; 454/184, 285; 312/236; 165/908, 121–126, 80.3; 257/712, 257/713, 723, 724; 62/414, 418, 259.2; 174/15.1, 174/16.1; 29/890.039, 832; 34/229, 488
See application file for complete search history.

(56) References Cited

U.S. PATENT DOCUMENTS

| 4,741,385 | A | 5/1988 | Bergles et al. | |
| 6,418,016 | B1 * | 7/2002 | Chiriac et al. | ............... 361/695 |
| 6,431,260 | B1 | 8/2002 | Agonafer et al. | |
| 6,688,110 | B2 | 2/2004 | Dailey et al. | |
| 7,283,365 | B2 | 10/2007 | Craft, Jr. | |
| 2006/0164805 | A1 * | 7/2006 | Meinders et al. | ............ 361/689 |

* cited by examiner

*Primary Examiner*—Zachary M Pape
(74) *Attorney, Agent, or Firm*—Meschkow & Gresham, P.L.C.

(57) ABSTRACT

A system (50) for cooling a target element (56) includes a structure (52) having an opening (62) extending through the layer (52), a pumping device (32) positioned behind the structure (52), and a target element (56) positioned in front of the structure (52). Transducers (58, 60) are positioned at opposing ends (74, 76) of the opening (62) between the structure (52) and the target element (56). The pumping device (32) drives a jet (70) of coolant through the opening (62) toward the target element (56). The transducers (58, 60) produce output signals (84, 86) that perturb the jet (70) to control oscillation of the jet (70) in order to stabilize the jet (70) for impingement with a predetermined location (96) on the target element (56). The jet (70) uniformly spreads from the location (96) to provide cooling over a surface (100) of the target element (56).

15 Claims, 4 Drawing Sheets

*PRIOR ART*

SYSTEM AND METHOD FOR COOLING USING IMPINGING JET CONTROL

TECHNICAL FIELD OF THE INVENTION

The present invention relates generally to electrical equipment. More specifically, the present invention relates to a system and method for cooling microelectronic devices.

BACKGROUND OF THE INVENTION

Maintaining electrical devices and equipment within specified temperatures is an important requirement for maintaining the operability of those devices. In the field of microelectronics, for example, microchips such as microprocessors must be maintained at or below maximum temperatures during operation to prevent the self-destruction of the microchips. Recent and continuing increases in the processing power and operating speeds of microchips has led to increases in the power dissipation of those microchips. For example, new high-powered chips can dissipate at least 10 Watts of power per chip and have heat fluxes as high as 500 W/cm$^2$. Consequently, the cooling of microchips during their operation is becoming even more critical as the performance of those microchips becomes even greater.

Numerous techniques for cooling currently exist. With respect to the cooling of microchips in particular, many existing cooling techniques incorporate large and costly heat spreaders and heat sinks, which impose limits on package size and functionality. Other techniques involve directing one or more jets or streams of cool air or other gas (or liquid) at or along the one or more microchips that require cooling.

Referring to FIGS. 1 and 2, FIG. 1 shows a cross-sectional view of a prior art impinging jet system 20 for cooling microelectronic devices 22, and FIG. 2 shows a series of charts 24, 26, 28 representing airflow variation and vortex formation over time in the cross-sectional view of the prior art impinging jet system 20 cooling microelectronic devices 22. Impinging jet system 20 includes a jet 30 of fluid or coolant, such as air, that is generated by a pumping device 32, such as a fan or blower. Pumping device 32 drives jet 30 through an opening 34 in a material layer 36 spaced apart from an underlying target element, such as a circuit board 38. Jet 30 is directed toward circuit board 38, which supports a variety of heat generating elements such as microelectronic devices 22. In one example, jet 30 is generally directed toward one of microelectronic devices 22, referred to herein as a target 40, along an axis 42.

Jet 30 of impinging jet system 20 flows in an unsteady laminar flow mode. More particularly, jet 30 "buckles" or oscillates back and forth about axis 42 so that its central core is not always parallel to axis 42. This oscillation occurs in part due to the existence of vortices 44 (shown in FIG. 2). Vortices 44 are areas of high recirculation near opening 34 which can distort jet 30, entrain or remove some of the cool air from jet 30 exiting opening 34, and eliminate warmer air at the top of the space between material layer 36 and circuit board 38 where air exits the space. Due to this oscillation, jet 30 varies in its position relative to axis 42. In addition, a phenomenon related to the buckling occurs in which a central tip, or stagnation point 46, of jet 30 "sweeps" or moves back and forth along its target, e.g., target 40. This sweeping is represented in FIG. 1 by a bi-directional arrow 48. This sweeping is further represented in FIG. 1 by showing multiple axes 42 about which jet 30 oscillates, each of multiple axes 42 representing a different instant in time.

Stagnation point 46 is the point at which greatest pressure of jet 30 is provided against microelectronics devices 22, and is consequently where the greatest amount of cooling and maximum heat transfer coefficients occur. As a result of the sweeping motion of the tip of jet 30 across target 40, the position of stagnation point 46 moves back and forth relative to target 40 such that the portion of target 40 receiving the greatest amount of cooling varies in time. Such a phenomenon, referred to herein as an uncontrolled (or un-forced) jet technique, yields effective local cooling at target 40 but less uniform cooling for some remaining microelectronic devices 22 that also have high heat fluxes.

In order to provide cooling over greater areas, prior art solutions entail directing multiple steady (i.e., non-buckling) impinging jets 30 parallel to one another from respective rectangular openings 34 in material layer 36. By using multiple steady jets 30, the heat transfer coefficient may be maintained at a more uniform level over a wider region of circuit board 38, over two (or more) microelectronic devices 22. As such the temperature along a top surface of microelectronic devices 22 and circuit board 38 may be reduced over a larger area.

However, a multiple jet impinging system may still produce non-uniformities in heat transfer across the surface of circuit board 38 thus leading to inefficiencies in cooling. Typically, material layer 36 is a circuit board with its own microelectronic devices coupled to it. Thus, multiple openings 34 in such a circuit board utilize an undesirably large amount of space that could be better served for the attachment of devices and the formation of electrically conductive traces. In addition, the inclusion of multiple openings 34 calls for additional design and manufacturing processes which drives up cost. Furthermore, the multiple openings 34 may necessitate additional pumping devices 32 or structure to direct coolant flow to the multiple openings 34, further driving up costs.

Thus, what is needed is a technique for effectively cooling microelectronic devices which provides a generally uniform cooling effect. What is further needed is a technique that can be cost effectively implemented and can provide flexibility in cooling capabilities.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION

An embodiment of the invention entails a system for cooling using a jet impinging system that includes a control mechanism for controlling the jet as it impinges a target element to provide generally uniform cooling of the target element. Another embodiment of the invention entails a method for cooling by controlling an impinging jet and for enabling cooling capability flexibility by controlling the impinging jet or by alternatively abstaining from controlling the impinging jet. The system and methodology may be implemented in a variety of cooling applications for cooling high power microelectronic devices, such as memory, logic, microcontrollers, microprocessors, power amplifiers, power management modules, and so forth.

Figure 3:
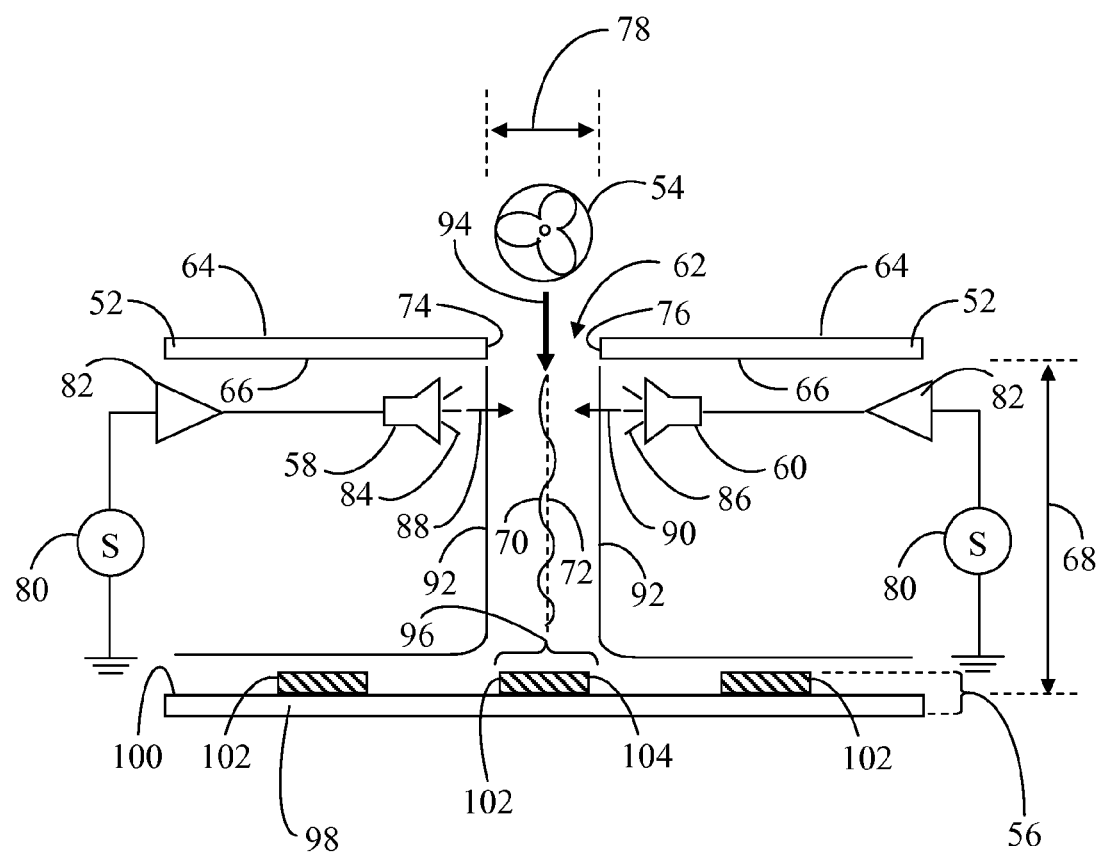
FIG. 3 shows a cross-sectional view of a controlled jet system for cooling.

FIG. 3 shows a cross-sectional view of a controlled jet system 50 for cooling. System 50 includes a structure, also referred to herein as a material layer 52, a pumping device 54, a target element 56, and transducers 58 and 60. An opening 62 extends through material layer 52 from an outer surface 64 to an inner surface 66 of material layer 52. Pumping device 54 is positioned in front of material layer 52 proximate outer surface 64. Target element 56 is spaced apart from inner surface 66 of material layer 52 by a predetermined distance 68. Transducers 58 and 60 are positioned between material layer 52 and target element 56, nearer to opening 62.

Pumping device 54 may be a fan, blower, or the like, that generates a jet 70 of fluid or coolant (typically air) and drives jet 70 through opening 62 in material layer 52. Jet 70 is directed toward target element 56 along its axis 72 for impingement, i.e., collision, with target element 56. In one embodiment, opening 62 is a generally rectangular slot having ends 74 and 76 that are spaced apart by a length 78 of, for example, one centimeter. Transducer 58 is positioned proximate opening 62 at end 74 and transducer 60 is positioned proximate opening 62 at end 76. Transducers 58 and 60 are driven by a signal source 80. A signal amplifier 82 may be interposed between signal source 80 and transducers 58 and 60. Transducers 58 and 60 may be speakers, microelectromechanical systems (MEMS) devices, micro-fluidic devices, piezoelectric membrane devices, and the like capable of perturbing jet 70 when actuated.

In response to actuation by signal source 80, transducers 58 and 60 produce respective output signals 84 and 86 for perturbing jet 70. More particularly, a projected direction 88 of output signal 84 faces a projected direction 90 of output signal 86 on opposing edges 92 of jet 70. In addition, projected directions 88 and 90 of respective output signals 84 and 86 are generally perpendicular to a flow direction, represented by an arrow 94, of jet 70. Output signals 84 and 86 control an oscillation of jet 70 relative to axis 72 in order to stabilize jet 70 for impingement at a predetermined location 96 on target element 56 (discussed below) to provide localized cooling. That is, jet 70 is generally concentrated at predetermined location 96 to provide maximum downward momentum of jet 70 at predetermined location 96. In addition, jet 70 spreads outwardly from predetermined location 96 in a generally uniform manner so as to provide effective overall cooling of target element 56, as opposed to the prior art uncontrolled (i.e., unforced) jet technique where primarily the local cooling is enhanced.

In one embodiment, target element 56 includes a circuit board 98 having a surface 100 that faces inner surface 66 of material layer 52. Circuit board 98 supports a variety of heat generating elements, illustrated by multiple microelectronic devices 102 coupled to surface 100, to be cooled. The combined assembly of circuit board 98 and microelectronic devices 102 may be considered target element 56. In another embodiment, only microelectronic devices 102 may be considered target element 56 when circuit board 98 is formed of materials that do not allow heat transfer into circuit board 98.

As illustrated herein, one of microelectronic devices 102 may be considered a critical microelectronic device 104. Microelectronic device 104 is referred to herein as being "critical" because it generates a greater amount of heat (for which cooling is required) than the surrounding microelectronic devices 102. System 50 provides generally uniform cooling of target element 56, e.g. circuit board 98 and microelectronic devices 102. However, there is a region, i.e., predetermined location 96, that receives greater localized cooling due to a greater momentum of jet 70 at predetermined location 96. It may therefore be advantageous to configure system 50 such that critical microelectronic device 104 is positioned at predetermined location 96. However, in another embodiment, critical microelectronic device 104 need not be coupled to circuit board 98 at predetermined location 96 but may instead be displaced from predetermined location 96. In yet another embodiment, none of microelectronic devices 102 may be deemed "critical" and overall uniform cooling of target element 56 may be sufficient for providing cooling capability.

Figure 4:
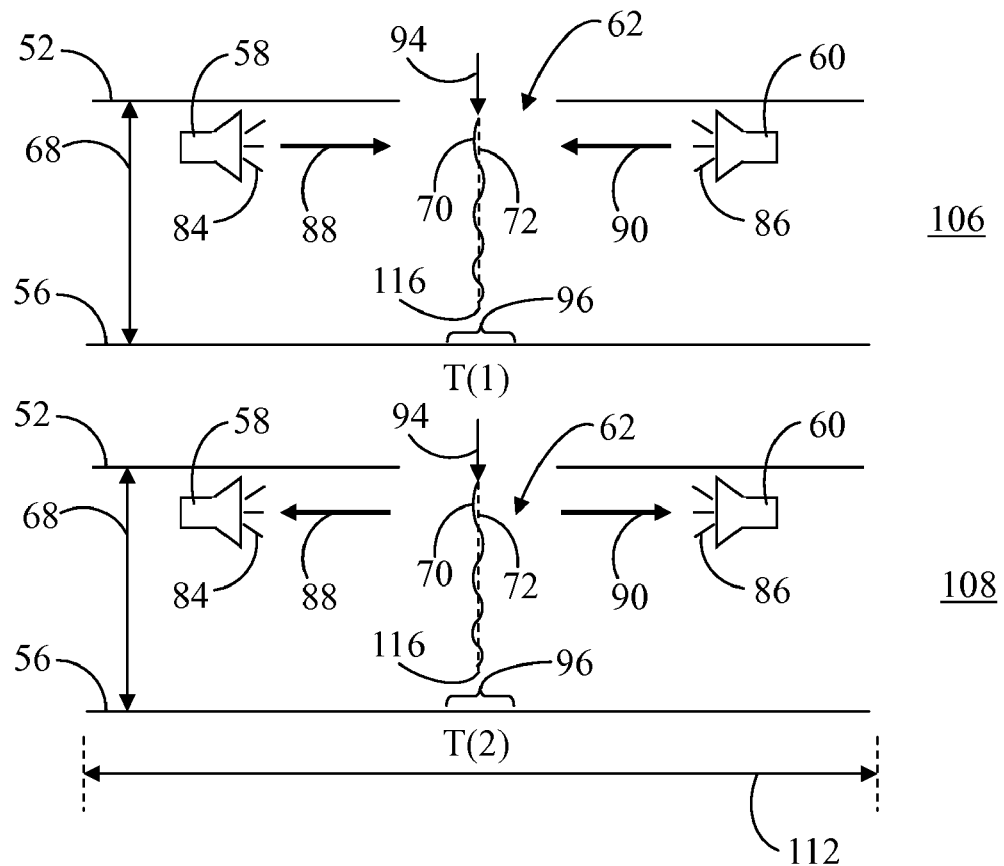
FIG. 4 shows partial cross-sectional views of the controlled jet system in time series, with transducers perturbing a jet in an out-of-phase mode.
Figure 5:
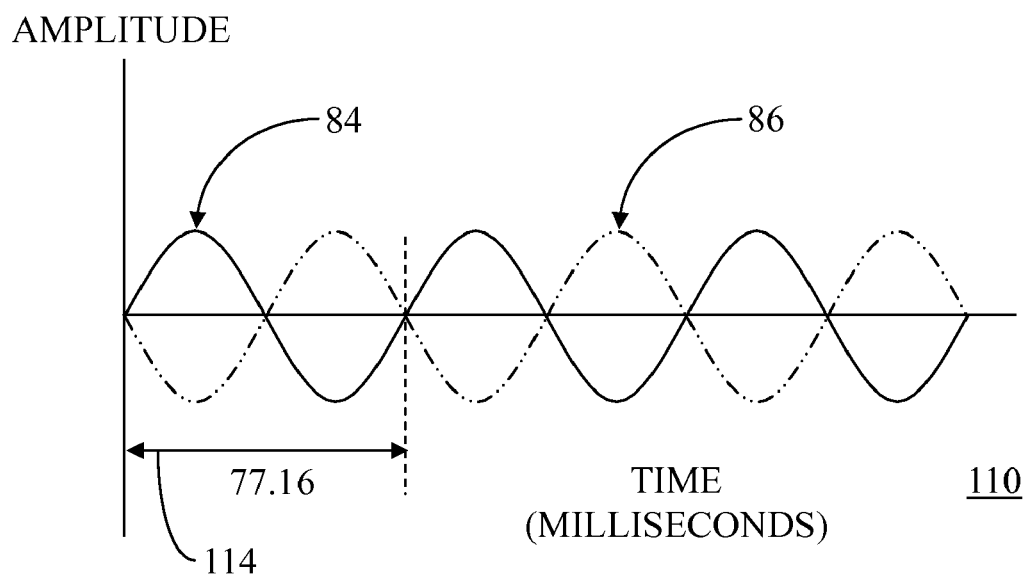
FIG. 5 shows a graph of output signals produced by the transducers of FIG. 4.

Referring to FIGS. 4 and 5, FIG. 4 shows partial cross-sectional views 106 and 108 of controlled jet system 50 (FIG. 3) in time series, with transducers 58 and 60 perturbing jet 70 of coolant in an out-of-phase mode, and FIG. 5 shows a graph 110 of output signals 84 and 86 produced by transducers 58 and 60, respectively. In an embodiment, each of output signals 84 and 86 is a sinusoidal signal corresponding to an oscillation frequency of jet 70. In addition, transducers 58 and 60 are actuated so that output signals 84 and 86 have a phase difference of approximately one hundred and eighty degrees (illustrated in FIG. 5). The out-of-phase mode is illustrated in views 106 and 108 of FIG. 4 by the arrowheads of directions 88 and 90 of respective output signals 84 and 86 pointing toward one another at one instant in time, T(1), and the arrowheads of directions 88 and 90 pointing away from one another at another instant in time, T(2).

Figure 1:
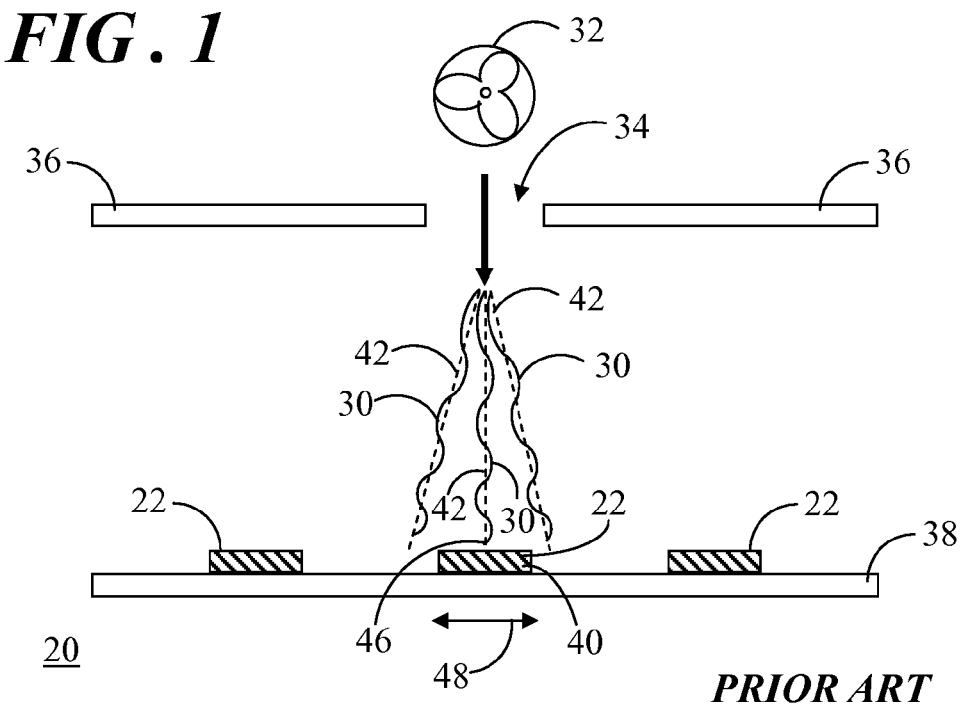
FIG. 1 shows a cross-sectional view of a prior art impinging jet system for cooling microelectronic devices.

Like jet 30 (FIG. 1) of the prior art impinging jet system 20 (FIG. 1), jet 70 flows in an unsteady laminar flow mode. That is, jet 70 "buckles" or oscillates back and forth about axis 72 so that its central core is not always parallel to axis 72. However, unlike the sweeping or flapping motion of the prior art impinging system 20 (FIG. 1), the position of jet 70 is "locked," i.e., non-varying over time (discussed below).

The unsteady laminar flow mode is a transitional mode of operation between the two normal modes of flow, namely a steady laminar flow mode and a turbulent flow mode. In general, the unsteady laminar flow mode only occurs for a jet that is directed over certain limited distances and that has a certain Reynolds number ("Re") values within a range of values for Re. In an embodiment, the distance over which jet 70 is directed is predetermined distance 68. Predetermined distance 68 may be maintained between 5-7 centimeters (cm) which is a conventional distance between motherboards in a typical printed circuit board rack. For particular jet velocities for jet 70, at less than 5 cm there may be insufficient space within which the "buckling" or oscillation of jet 70 may occur and at greater than 7 cm, jet 70 may fail to retain sufficient momentum to allow the "buckling" or oscillation of jet 70 to occur. Consequently, in either case (below 5 cm or above 7 cm), jet 70 may not oscillate at particular jet velocities for jet 70.

The Reynolds number, Re, which is well known in the art, is defined as equaling the product of the hydraulic diameter (D), velocity (v) and density of the gas/liquid (ρ) of the jet, divided by the viscosity (μ) of the gas/liquid, where the hydraulic diameter, D, is double the length 78 of opening 62 (i.e., equaling double the width of jet 70). In this scenario, the jet velocity (v) is 0.4725 m/s, the hydraulic diameter (D) is 0.02 m, the density (ρ) is approximately 1.16 kg/m$^3$ (at 27 degrees Celsius), and the viscosity (μ) is approximately 1.85× 10$^{-5}$ (at 27 degrees Celsius). Thus, a computed Reynolds number for this embodiment is approximately 600. The Reynolds number may be maintained between 550 and 750 because at less than 550, the flow of jet 70 may be laminar, whereas at greater than 750 the flow of jet 70 may be turbulent. Accordingly, a Reynolds number within a range of values between 550 and 750 can yield the desired unsteady laminar flow characteristic.

In the example set forth above, the hydraulic diameter (D) is 2 cm, which is double length 78 of opening 62. Additionally, a length 112 of each of material layer 52 and target element 56 is significantly longer than that of slotted opening 78, for example 10 cm, 30 cm, or more. A narrow, rectangular slot is employed at opening 62 so that the "buckling" or oscillation of jet 70 about its axis 72 occurs within a single dimension, that is, so that the "buckling" will occur within or parallel to a plane formed by axis 72 and the long axis (generally the axis of the longest side, i.e., length 78) of opening 62. In alternate embodiments, in which opening 62 has a shape other than a rectangular slot, the oscillations of the jet 70 can occur in more than one dimension in a more complicated manner. Further in alternate embodiments, the opening 62 can be formed by a nozzle or other element rather than merely a slot within material layer 52.

In alternate embodiments, predetermined distance 68, the Reynolds number and the component factors of the Reynolds number including the shape and size of the opening 62, the velocity of jet 70, and the type of gas/liquid can be varied to get the desired "controlled jet" effect. However, although a variety of combinations are possible, the various dimensions of system elements, Reynolds number and coolant that are chosen must be set so that jet 70 operates in the unsteady laminar flow mode, i.e., the transition between the steady laminar flow mode and the turbulent flow mode.

Given predetermined distance 68 (i.e., the spacing between material layer 52 and target element 56), the Reynolds number and the component factors of the Reynolds number, including the shape and size of opening 62, the velocity of jet 70, and the density and viscosity of the coolant to be used (e.g., air), a frequency of "buckling" (oscillation frequency) of jet 70 about axis 72 is 12.96 Hz. The oscillation frequency is associated with the primary motion of jet 70 about its axis 72 induced by the recirculation vortices that move on both sides of jet 70. The oscillation frequency of jet 70 about its axis 72 is used to drive the sinusoidal frequency of output signals 84 and 86. That is, as shown in FIG. 6, a period 114 for each of output signals 84 and 86 is 77.16 msec, so as to yield the frequency of 12.96 Hz.

When transducers 58 and 60 are driven such that output signals 84 and 86 are produced at a sufficient amplitude and at a frequency that is substantially equivalent to the oscillation frequency of jet 70 and with a one hundred and eighty degree phase difference, the sweeping oscillation of stagnation point 46 (FIG. 1) that occurs in the prior art impinging jet system 20 (FIG. 1) is largely prevented. Thus, a tip 116, or a stagnation point, of jet 70 focuses at predetermined location 96 and its position remains largely non-varying over time.

Figure 6:
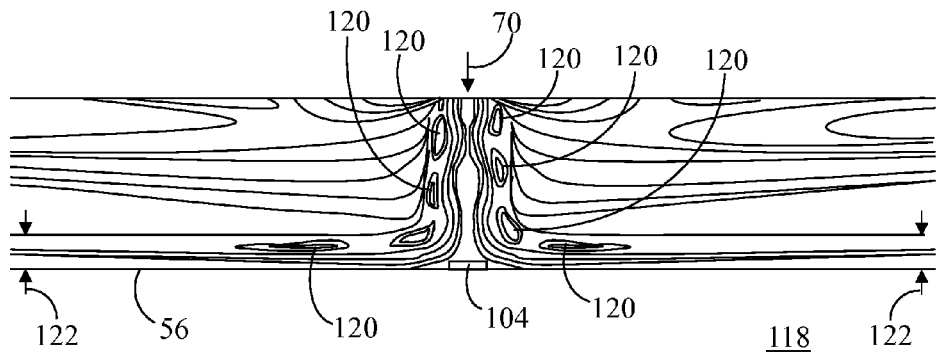
FIG. 6 shows a chart representing airflow variation and vortex formation at an instant in time in the cross-sectional view of the impinging jet system of FIG. 3.

FIG. 6 shows a chart 118 representing airflow variation and vortex formation at an instant in time in the cross-sectional view of controlled jet system 50 (FIG. 3). When transducers 58 and 60 (FIG. 3) produce output signals 84 and 86 (FIG. 3) at the oscillation frequency of jet 70 and one hundred and eight degrees out-of-phase relative to one another, vortices 120 form. Like system 20 (FIG. 1), vortices 120, i.e., areas of high recirculation near opening 62 (FIG. 3) are formed when jet 70 "buckles" or oscillates back and forth about its axis 72 in the unsteady laminar flow mode (i.e., the transition between laminar and turbulent flow modes). However, due to output signals 84 and 86 (FIG. 3) perturbing jet 70 at the oscillation frequency of jet 70, vortices 120 substantially align in pairs on opposing edges 92 (FIG. 3), i.e., the shear layer, of jet 70. That is, control of jet 70 aligns vortices 120 on the shear layer of jet 70 so as to stabilize the core of jet 70.

This alignment of vortices 120 on the shear layer of jet 70 stabilizes the core of jet 70 by "driving" the flow of jet 70 in a more columnar manner so as to concentrate jet 70 at predetermined location 96 (FIG. 3). Moreover, since tip 116 is the point at which the greatest pressure of jet 70 is provided, the greatest amount of cooling will occur at predetermined location 96. In addition, as jet 70 impinges predetermined location 96, jet 70 spreads outwardly from predetermined location 96 in a generally uniform manner with the greatest coolant flow occurring across the surfaces of microelectronic devices 102 (FIG. 3).

Accordingly, perturbation of jet 70 by output signals 84 and 86 to control jet 70 can result in greatly increased localized cooling capability at predetermined location 96 and can further result in enhanced overall cooling of circuit 98 (FIG. 3) and microelectronic devices 102 (FIG. 3) that are displaced from predetermined location 96. This uniform cooling is represented by a generally linear outward airflow region 122 along target element 56. Thus, the "control" of jet 70 leads to significant heat transfer enhancement as the flow of jet 70 stabilizes and reaches highest momentum.

Figure 7:
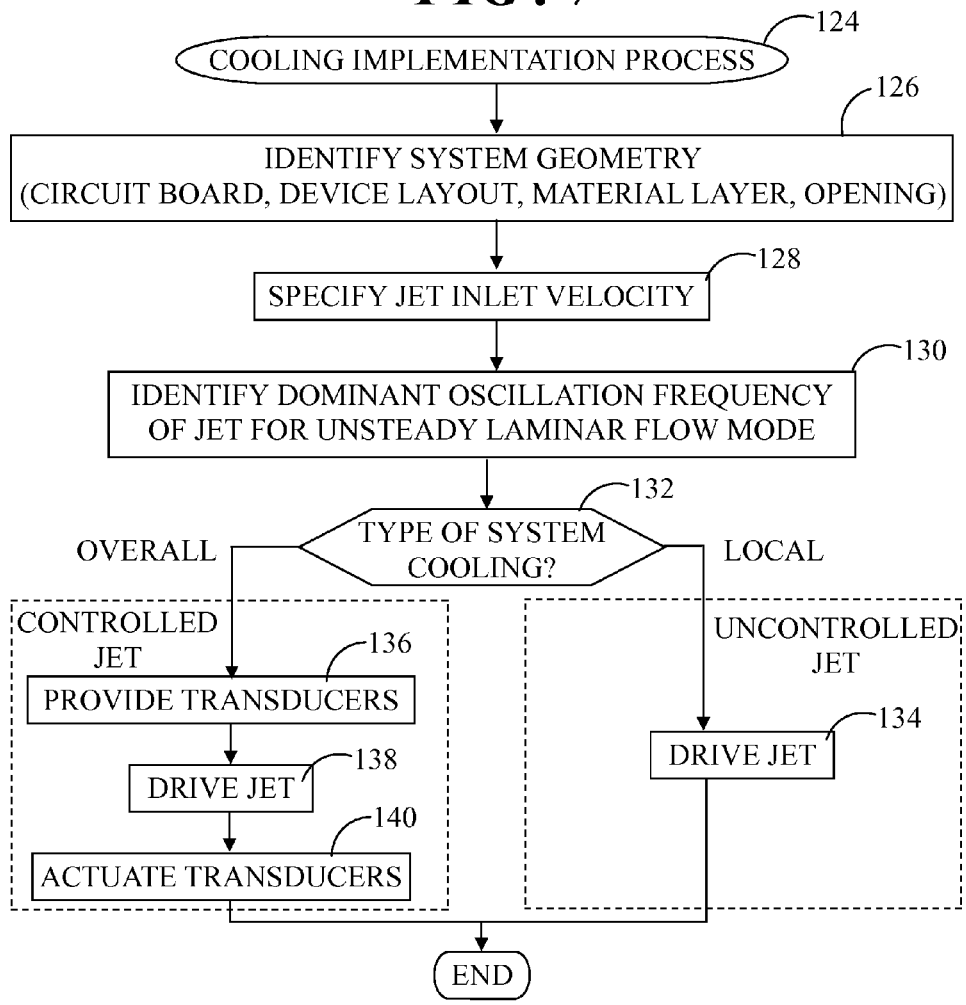
FIG. 7 shows a flowchart of a cooling implementation process.

FIG. 7 shows a flowchart of a cooling implementation process 124. Process 124 describes methodology in which a manufacturing facility, design team, and the like can determine and implement an appropriate cooling technique for a particular hardware configuration. Process 124 is provided for exemplary purposes. Those skilled in the art should understand, however, that the process steps discussed below can take on a great number of variations and can be performed in a differing order then that which is presented.

Cooling implementation process 124 begins with a task 126. At task 126, the system geometry is identified. Such identification criteria includes, for example, the layout of microelectronic devices 102 (FIG. 3) on circuit board 98 (FIG. 3), the overall heat production of circuit board 98, and identification of one or more "critical" microelectronic devices 104 (FIG. 3) on circuit board 98. Further identification criteria includes the layout of microelectronic devices (if any) on material layer 52 (FIG. 3), the creation of opening 62, the arrangement of material layer 52 substantially parallel to circuit board 98 and separated by predetermined distance 68 (FIG. 3), and so forth.

Following task 126, a task 128 is performed. At task 128, the inlet velocity for jet 70 is specified. The inlet velocity is the velocity of jet 70 as it passes through opening 62 and into the space between material layer 52 and circuit board 98. In the example discussed above, an inlet velocity of jet 70 was suggested as being 0.4725 m/s. However, it should be understood from the above discussion, that an appropriate inlet velocity (in combination with the size of opening 62, the density and viscosity of the coolant) should be selected to obtain a Reynolds number, in combination with the spacing between material layer 52 and circuit board 98, sufficient to cause the unsteady laminar flow mode of jet 70.

Figure 2:
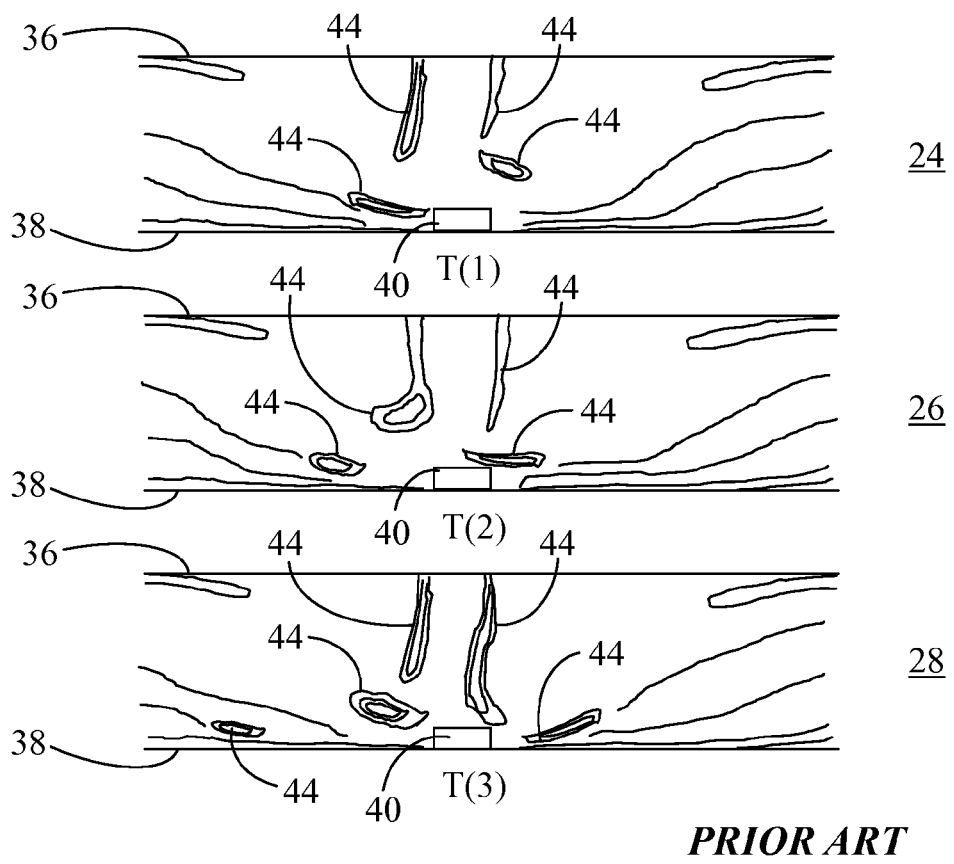
FIG. 2 shows a series of charts representing airflow variation and vortex formation relative to time in the cross-sectional view of the prior art impinging jet system the cooling microelectronic devices.

Next, a task 130 is performed. At task 130, the dominant oscillation frequency of jet 70 is identified for the unsteady laminar flow mode. In the example discussed above, the dominant oscillation frequency of jet 70 is 12.96 Hz. However, is should be understood that with different geometric configurations and/or different values of the Reynolds number, a different oscillation frequency of jet 70 about its axis 72 may occur. One possible means for determining the oscillation frequency would be to drive jet 70 through opening 62 in the identified geometric configuration without actuating transducers 58 and 60 (FIG. 3). Vortices 44 (FIG. 2) can then be detected and measured or otherwise counted to determine the oscillation frequency.

Next, a query task 132 is performed. At task 132, a determination is made as to which of a controlled jet technique or an uncontrolled jet technique for cooling would be most suitable for the current design configuration. This determination is based upon information amassed through the execution of tasks 126, 128, and 130. When design requirements call for localized cooling at query task 132, an uncontrolled jet technique may be implemented. As such, cooling implementation process 124 proceeds to a task 134. At task 134, jet 70 is driven through opening 62 (FIG. 3) and allowed to oscillate and "sweep" as discussed in connection with the prior art impinging jet system 20 (FIG. 7). Following task 134, cooling implementation process 124 exits.

When design requirements call for overall, or uniform, cooling at query task 132 with or without enhanced localized cooling at predetermined location 96 (FIG. 3), a controlled jet technique may be implemented. As such, cooling implementation process 124 proceeds to a task 136. At task 136, transducers 58 and 60 are provided and arranged proximate inner surface 66 (FIG. 3) of material layer 52 (FIG. 3) at ends 74 and 76 (FIG. 3) of opening 62.

Next, at a task 138, jet 70 is driven through opening 62 (FIG. 3) and is allowed to oscillate. However, at a task 140, performed in connection with task 138, transducers 58 and 60 are actuated to produce output signals 84 and 84 (FIG. 3) so as to perturb jet 70 to control the oscillation, or sweeping motion, of jet 70 such that jet 70 stabilized for impingement on critical microelectronic device 104 (FIG. 3) at predetermined location 96 and subsequently spreads from predetermined location 96 to provide substantially uniform cooling of microelectronic devices 102 (FIG. 3) coupled to surface 100 (FIG. 3) of circuit board 98 (FIG. 3). Following task 140, cooling implementation process 124 exits.

An embodiment described herein comprises a system and method for cooling a target element, such as microelectronic circuits coupled to a circuit board. A jet of coolant, such as air, is directed through an opening in a material layer toward a target element along an axis, the jet being made to oscillate or buckle about that axis. Transducers positioned between the material layer and the target near the opening are actuated to perturb the jet in a direction substantially perpendicular to the jet. The flow of jet is controlled through out-of-phase forcing at the dominant oscillation frequency for the unsteady laminar flow mode of the jet. Control of the jet stabilizes both jet edges to obtain maximum downward momentum. Thus, the jet washes the target surface without separation, thereby enhancing local cooling. Moreover, overall cooling of the circuit board is significantly enhanced when controlling the jet due to relatively uniform dispersion of the jet following its impingement on the surface of the target element. The system and method can be cost effectively implemented. Furthermore, methodology facilitates decision making when determining a particular cooling implementation to provide flexibility in cooling capabilities.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A system for cooling comprising:
    a structure having an opening extending through said structure;
    a pumping device behind said structure that drives a jet of coolant through said opening;
    a target element positioned in front of said structure so that said jet, driven through said opening, is directed toward said target element; and
    a transducer positioned between said structure and said target element, said transducer producing an output signal for perturbing said jet to control an oscillation of said jet in order to stabilize said jet for impingement with a predetermined location on said target element, wherein a predetermined distance between said opening and said target element, a size of said opening, and a velocity at which said pumping device drives said jet through said opening causes said jet to flow in an unsteady laminar flow mode, and perturbation of said jet by said output signal causes a tip of said jet to be substantially non-varying in position over time.

2. A system as claimed in claim 1 wherein said target element comprises:
    a circuit board having a first surface facing said jet of said coolant;
    a first microelectronic device coupled to said first surface at said predetermined location, said first microelectronic device dissipating heat; and
    second microelectronic devices coupled to said first surface and displaced from said predetermined location, said second microelectronic devices dissipating less heat than said first microelectronic device, said jet providing localized cooling of said first microelectronic device at said predetermined location and said jet spreading outwardly from said predetermined location to provide substantially uniform cooling of said second microelectronic devices displaced from said predetermined location.

3. A system as claimed in claim 1 wherein said jet is directed through said opening in a first direction and said output signal of said transducer perturbs said jet in a second direction that is substantially perpendicular to said first direction.

4. A system as claimed in claim 1 wherein said transducer is a first transducer, said output signal is a first output signal, and said system further comprises a second transducer positioned between said structure and said target element, said second transducer producing a second output signal for perturbing said jet.

5. A system as claimed in claim 4 wherein each of said first and second transducers are positioned above said target element at opposing ends of said opening so that a first projected direction of said first output signal faces a second projected direction of said second output signal.

6. A system as claimed in claim 4 wherein said first and second output signals are sinusoidal signals exhibiting a perturbation frequency that corresponds to an oscillation frequency of said jet about said axis.

7. A system as claimed in claim 6 wherein:
said opening is a slot having a first end spaced apart from a second end;
said first transducer is located at said first end; and
said second transducer is located at said second end.

8. A system as claimed in claim 4 wherein said first and second transducers are actuated so that a phase difference between said first and second output signals is approximately one hundred and eighty degrees.

9. A system as claimed in claim 1 wherein said unsteady laminar flow mode is indicated by a range of values of a Reynolds number representing a transition between a laminar flow and a turbulent flow of said jet.

10. A system as claimed in claim 9 wherein said range of values of said Reynolds number is approximately 550-750 for said unsteady laminar flow mode.

11. A method for cooling a microelectronic device coupled to a circuit board at a predetermined location comprising:
determining a mode of cooling for said circuit board to which a plurality of microelectronic devices are coupled, said microelectronic device being one of said plurality of microelectronic devices;
driving a jet of coolant from a back side of a material layer through an opening in said material layer toward said circuit board, said material layer being arranged substantially parallel to and spaced apart from said circuit board by a predetermined distance, said jet exhibiting an oscillation frequency relative to its axis, said driving operation directing said jet toward said circuit board, and a tip of said jet oscillating with respect to said circuit board so that said jet impinges a variety of locations on said circuit board;
actuating a transducer positioned between said material layer and said circuit board to produce an output signal exhibiting a perturbation frequency that is substantially equivalent to said oscillation frequency, said output signal perturbing said jet to control an oscillation of said jet in order to stabilize said jet for impingement with said microelectronic device at said predetermined location;
when said determining operation determines an overall cooling mode for said circuit board, performing said driving and actuating operations; and
when said determining operation determines a local cooling mode for said circuit board, performing said driving operation and abstaining from performing said actuating operation.

12. A method as claimed in claim 11 wherein said opening is a rectangular slot having first and second ends, said transducer is a first transducer located at said first end, said output signal is a first output signal, and said actuating operation comprises actuating a second transducer to produce a second output signal for perturbing said jet, said second transducer being positioned between said material layer and said circuit board and located at said second end of said opening, said second output signal exhibiting said perturbation frequency.

13. A method as claimed in claim 12 wherein said first and second transducers are positioned above said target element so that a first projected direction of said first output signal faces a second projected direction of said second output signal.

14. A method as claimed in claim 12 wherein said actuating operation further comprises actuating said first and second transducers so that said first and second output signals are sinusoidal signals exhibiting a phase difference of approximately one hundred and eighty degrees.

15. A method as claimed in claim 11 wherein second microelectronic devices are coupled to said circuit board displaced from said predetermined location, said first microelectronic device dissipates heat, said second microelectronic devices dissipate less heat than said first microelectronic device, and said actuating operation comprises concentrating said jet to provide localized cooling of said first microelectronic device at said predetermined location and to provide substantially uniform cooling of said second microelectronic devices displaced from said predetermined location.

* * * * *